United States Patent [19]
De Bar et al.

[11] 4,078,243
[45] Mar. 7, 1978

[54] PHOTOTRANSISTOR ARRAY HAVING UNIFORM CURRENT RESPONSE AND METHOD OF MANUFACTURE

[75] Inventors: David E. De Bar, Manassas; Francisco H. De La Moneda, Reston, both of Va.

[73] Assignee: International Business Machines Corporation, Armonk, N.Y.

[21] Appl. No.: 640,376

[22] Filed: Dec. 12, 1975

[51] Int. Cl.$^2$ .............................................. H01L 27/14
[52] U.S. Cl. ........................................ 357/32; 29/572; 29/574
[58] Field of Search ....................... 357/32, 30; 29/572, 29/574, 591, 592; 250/211 R, 211 J, 208

[56] References Cited

U.S. PATENT DOCUMENTS

| | | | |
|---|---|---|---|
| 3,448,344 | 6/1969 | Schuster et al. | 357/32 |
| 3,558,974 | 1/1971 | Stewart | 315/169 |
| 3,584,183 | 6/1971 | Chiaretta et al. | 219/121 |
| 3,774,088 | 11/1973 | Magdo et al. | 357/48 |
| 3,858,233 | 12/1974 | Miyata et al. | 357/30 |
| 3,925,879 | 12/1975 | Weinstein | 357/30 |

OTHER PUBLICATIONS

Eisenmann et al., "Polymer Field Stop for Electrooptic Device," *IBM Technical Disclosure Bulletin*, vol. 17, No. 3, Aug. 1974, pp. 935–936.

*Primary Examiner*—Stanley D. Miller, Jr.
*Assistant Examiner*—James W. Davie
*Attorney, Agent, or Firm*—J. C. Redmond, Jr.

[57] ABSTRACT

Variations of current gain from element to element in a phototransistor array are eliminated by covering the array with an opaque mask and etching openings in the mask over each phototransistor based upon an area reduction factor (ARF). The area reduction factor for an opening is equal to $(I_m/I_x)^{1-n}$ where $n$ is a constant definitive of the change in beta of a phototransistor in the array over a given range of collector currents; $I_m$ is the minimum collector current measured for the array and $I_x$ is the collector current for the phototransistor beneath the opening. Based upon the ARF's, the openings etched in the mask or cover initiate uniform current from each phototransistor element when uniform light flux is directed on the array. The process of fabricating the array comprises measuring the collector current for each phototransistor element at a given uniform light flux; determining the element with minimum collector current in the array; calculating the ARF for each phototransistor to achieve a uniform current response from the array; coating the array with an opaque cover, and etching the cover at each phototransistor based upon the ARF.

6 Claims, 4 Drawing Figures

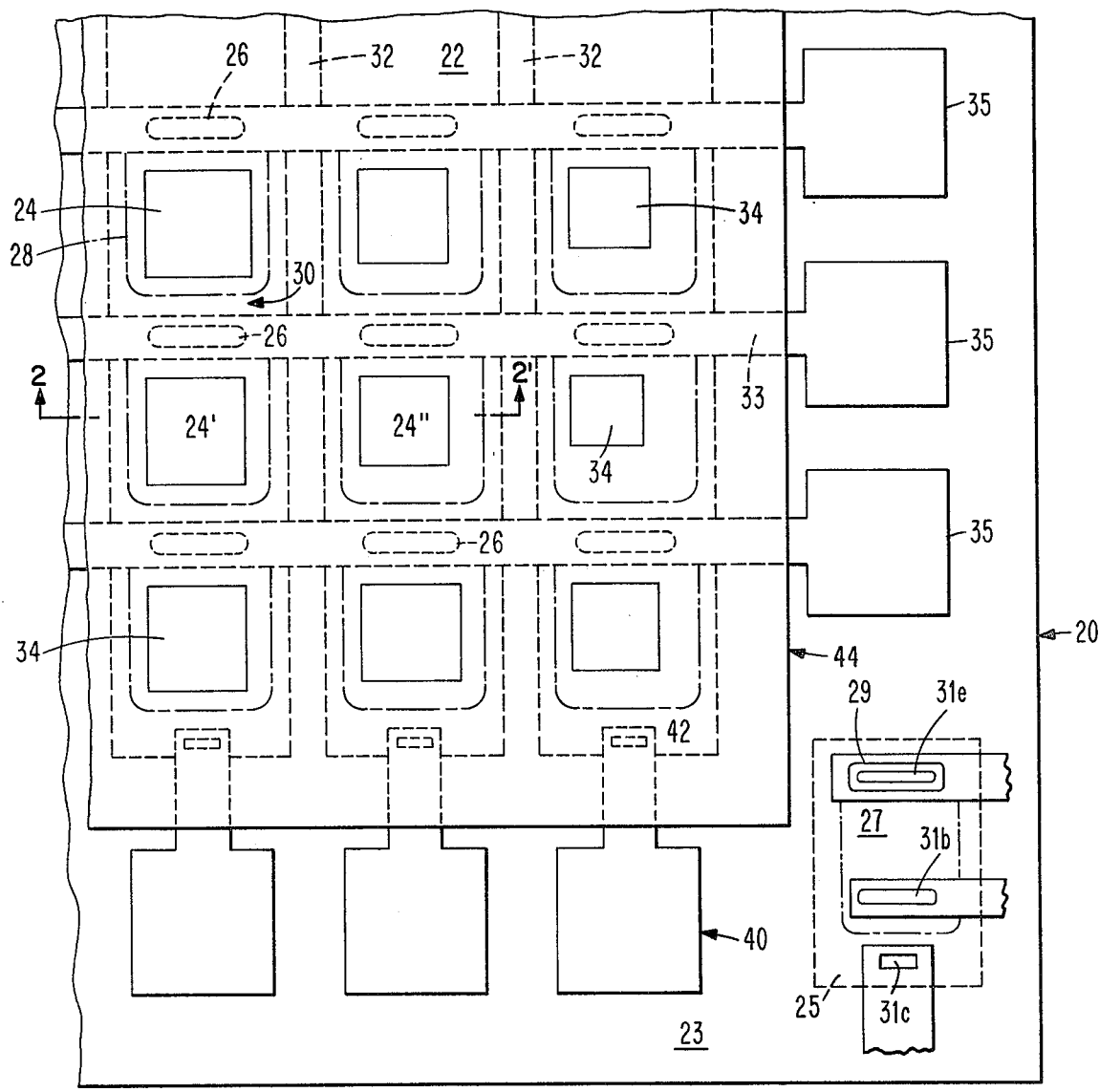
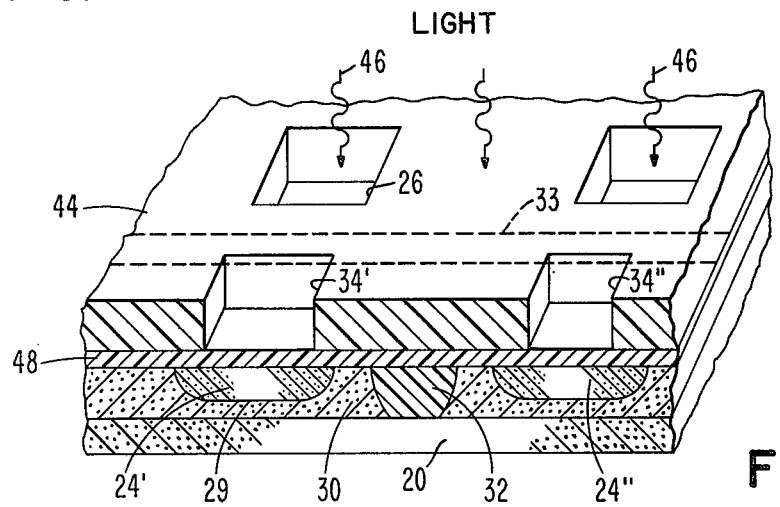
FIG. 1
FIG. 2

PHOTOTRANSISTOR ARRAY HAVING UNIFORM CURRENT RESPONSE AND METHOD OF MANUFACTURE

BACKGROUND OF THE INVENTION

A. Field of the Invention

This invention relates to photo responsive arrays and methods of manufacture. More particularly, the invention relates to integrated phototransistor arrays and methods of manufacture.

B. Description of the Prior Art

Photo sensing arrays translate optical information into corresponding electrical signals for processing. Photodiode and phototransistor arrays are available for such translation. Photodiode arrays generate a uniform current proportional to the light flux illuminating the surface of the array. Such arrays, however, are not sensitive to low light levels. Additionally, amplifiers are required for photodiode arrays to increase their electrical signals to a level sufficient for processing. Phototransistor arrays, in contrast, amplify currents generated by light flux illuminating the surface of the array. The amplifying qualities of phototransistor arrays permit them to operate at lower light levels than those for photodiode arrays. Unfortunately, the amplifying advantage of phototransistor arrays is offset by variations of beta or transfer efficiency of carriers flowing through the base region to the collector junction. Beta is sensitive to base width and surface recombination along the emitter periphery which may vary across the array. The variation in beta across the array results in different phototransistor currents for uniform light flux illuminating the array. The mode of operating also affects the performance of the phototransistor array. A direct current (DC) or continuous mode operation, as described in U.S. Pat. No. 3,617,823 issued Nov. 2, 1971, which utilizes the multiplication of the photon-generated carriers, is obviously sensitive to differences in beta across the array. A dynamic or storage mode of operation, as described in the article entitled "Operation of P-N Junction Photodetectors In A Photon Flux Integration Mode", by G. P. Weckler, IEEE Journal Solid State Circuits, Vol. SC-2, pgs 65–73, September 1967, which depends upon the collector base capacitance and not multiplication of photon generated carriers, is less sensitive to variations in beta. However, dynamically operated phototransistor arrays exceeding several hundred elements develop read out problems due to capacitance coupling between sensing lines. Also, dynamically operated phototransistor arrays require complex clocking and readout circuitry. A phototransistor array that is not limited by (1) beta variation, (2) complex clocking or readout circuitry or (3) size due to capacitance coupling will advance the technology of converting optical to electrical information.

SUMMARY OF THE INVENTION

An object of the invention is an array of photo responsive elements wherein all elements have substantially identical response to light flux.

Another object is a photo responsive array for relatively low light levels.

Another object is a phototransistor array with uniform current response for a DC mode of operation.

Another object is a photo sensitive array for translating large patterns of optical information into electrical signals.

Another object is a process for fabricating a phototransistor array with uniform current response.

In an illustrative embodiment, a plurality of phototransistors are formed in a semiconductor substrate. Appropriate conductors are formed on or in the substrare to arrange the phototransistors in an array. An opaque mask is adhered to the semiconductor surface and overlies the respective phototransistors. Openings are fomed in the mask over each phototransistor element. The area of the opening over each phototransistor element is adapted to compensate for changes in transfer efficiency of the respective phototransistors relative to the phototransistor in the array generating the lowest current level for uniform light flux. The area of the opening over each phototransistor is reduced by the relation: Area Reduction Factor (ARF) = $(I_m/I_x)^{1-n}$ where $I_m$ is the minimum collector current measured for the array; $I_x$ is the collector current for the phototransistor beneath an opening and $n$ is the slope of the log-log plot of beta $(\beta)$ versus collector current $(I_C)$ for each phototransistor in the array. The openings in the mask over each phototransistor, adjusted for the ARF, eliminate variations in current gain from phototransistor to phototransistor over the array thereby generating uniform current response to a uniform light flux illuminating the array.

The array is fabricated by (a) forming a phototransistor array in a semiconductor substrate, (b) measuring the current response $I_x$ of each phototransistor element to a uniform light flux, (c) determining the phototransistor element $T_m$ with the minimum current response or $I_m$, (d) increasing the flux density by increments over a given range and measuring the corresponding collector current response for the phototransistor having the minimum current response $I_m$, (e) calculating $n$ from the collector current response to the selected incremental illuminations, (f) calculating the area reduction factor (ARF) from the relationship $(I_m/I_x)^{1-n}$, previously described, (g) forming an opaque mask or cover over the surface of the substrate in which the phototransistors are formed, and (h) etching the cover at each phototransistor to form an opening thereover based upon the ARF associated with the phototransistor thereby to achieve a uniform current response for each phototransistor when subject to a uniform light flux.

A feature of the invention is a phototransistor array in a semiconductor substrate and an opaque mask over the phototransistors whereby openings in the mask associated with the respective phototransistors eliminate variations in output current from phototransistor to phototransistor for a uniform light flux illuminating the array.

Another feature is a phototransistor array in a substrate and having an opaque mask with openings over each phototransistor, the area ratio of the opening over each phototransistor relative to the phototransistor with minimum collector current is given by the relation: $(I_m/I_x)^{1-n}$ where $I_x$ is the current of the phototransistor associated with an opening, $I_m$ is the current of the phototransistor having the least collector current for a uniform light flux, and $n$ is the slope of the log-log plot of beta $(\beta)$ versus collector current $(I_C)$ for each phototransistor in the array.

Another feature is forming the opening on the base region of each phototransistor to limit the generation of carriers to the relatively flat or uniform bottom portion of the collector base junction thereby eliminating the generation of carriers near the surface of the phototransistor, which is sensitive to random amounts of charge in the oxide, and its adverse affects on beta.

Another feature is a process of calculating an area reduction factor, ARF, to determine the dimensions of openings in an opaque mask over a phototransistor array whereby variations in current are eliminated among the phototransistors for uniform light flux illuminating the array.

Another feature is electron beam etching a positive photoresist mask to form openings in the mask over a phototransistor array to achieve a uniform current response for each phototransistor when the array is subject to a uniform light flux.

BRIEF DESCRIPTION OF THE DRAWING

These and other objects, features and advantages of the invention will be more fully apprehended from the following detailed specification taken in conjunction with the appended drawings in which:

FIG. 1 is a partial plan view of a semiconductor substrate including an array of photo responsive elements.

FIG. 2 is an isometric view of a portion of the array of FIG. 1 along the line 2 – 2'.

Figure 3:
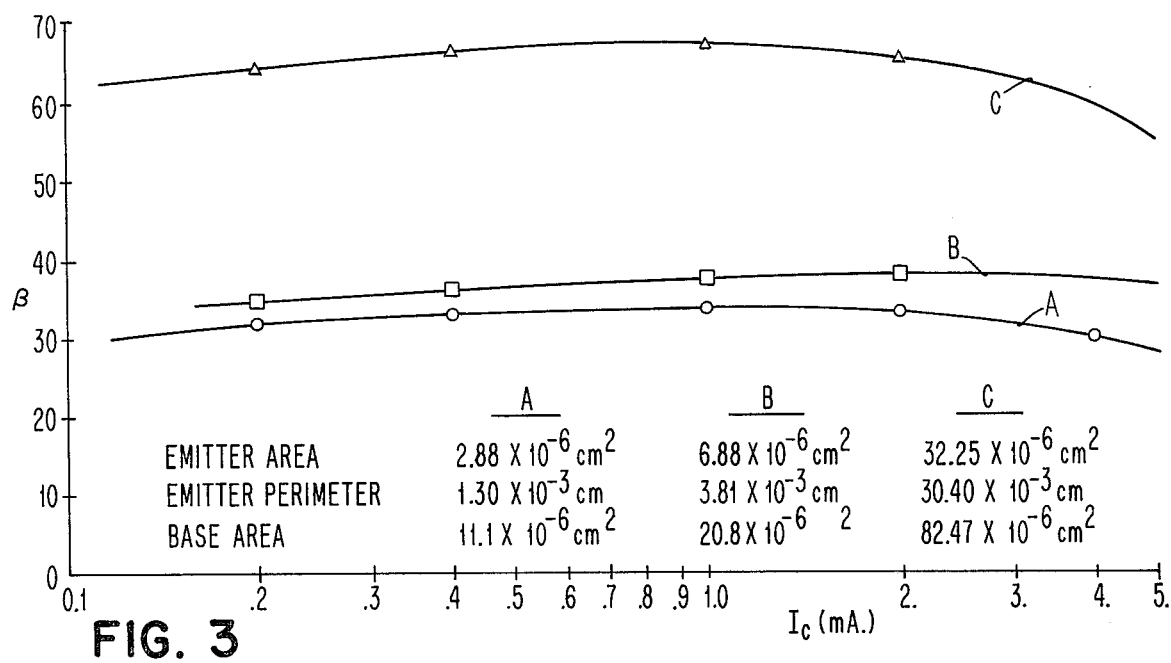
FIG. 3 is a semi-log graph of transfer efficiency or $\beta$ versus collector current $I_C$ for a plurality of different phototransistors of different design.

It will be understood that the array and the processes of the invention are described in terms of a single element. The steps of the process, however, are performed upon an entire wafer including a plurality of phototransistors.

DESCRIPTION OF PREFERRED EMBODIMENT

FIG. 1 shows a semiconductor chip 20 that includes an array or matrix 22 of phototransistor elements 24 typically $10^5$ elements and a test phototransistor 23, the latter to be described hereinafter in connection with FIG. 4. It should be understood the invention is applicable to any photosensitive array or device that operates in a direct current or continuous mode of which the phototransistor is a preferred element. Each phototransistor includes an emitter region 26, base region 28, and a common collector region 30 for those transistors in the same column of the matrix. Isolation regions 32 electrically isolate the columns in the matrix or array. Metal conductors 33 are disposed on the oxide and are connected to the emitters in the same row of the matrix. The conductors 33 connect to terminal pads 35 spaced about the periphery of the matrix. Similarly, metal terminal pads 40 connect to the common collector regions 30 of the respective phototransistors in the same column. The pads 40 extend through opening 42 in the oxide to establish ohmic contact with the common collector regions. An opaque mask 44 covers the matrix and includes openings 34 over the base region of each phototransistor. The openings vary in size, as will be described hereinafter, to enable each phototransistor element to generate substantially the same collector current for a uniform light flux illuminating the semiconductor 20.

FIG. 2 shows transistors 24' and 24" in greater detail. In one form, the opaque mask 44 is a polymer. One suitable polymer is a positive photoresist, typically poly-methyl-methacrylate (PPM) that incorporates lamp black, a finely ground carbon powder, to make the resist opaque to light radiation with the visual range, the desired operating spectrum for the array. Another material which may serve as an opaque mask is a carbon black filled polyimide as is described in IBM Technical Disclosure Bulletin, August 1974, page 935. The thickness of the mask is of the order of 5,000–10,000A. The mask is supported on an insulating layer 48, typically an oxide of the semiconductor which is grown, deposited or otherwise formed thereon to a thickness of 2,000–5,000A. The oxide protects the devices 24' and 24" in the semiconductor 20 and is transparent to the light flux 46. The devices 24' and 24" include base collector junction 29 and an emitter base junction (not shown). The conductor 33 contacts the emitter region (see FIG. 1). The isolation rail 32 isolates the devices 24' and 24" from one another.

An expression for the ARF is derived below with the aid of FIG. 3. FIG. 3 illustrates the dependence of beta on collector current for a set of three transistors fabricated using the same process. Plots A, B and C show (1) the emitter area and perimeter differing by as much as twenty times and (2) beta respectively varying by as much as two times, yet the slopes or beta change are substantially the same for all three plots up to the peak of beta. The invention capitalizes on this feature by assuming that all phototransistor elements in an array have the same slope beta change irrespective of the value of beta.

The following empirical relation can be written between beta ($\beta$) and collector current ($I_C$) for the phototransistors described by the plots A, B and C:

$$\beta = \beta' \left[ \frac{I_C}{I_{Cl}} \right]^n \quad (1)$$

where

B' = Beta measured at $I_C = I_{Cl}$ $I_C$ = collector current for the phototransistor at a selected illumination $I_{Cl}$ = a reference current in the neighborhood of the $\beta$peak, $n$ = slope of the log-log plot of beta versus collector current.

The collector current of the phototransistor can also be written using physical parameters as follows:

$$I_C = (1 + \beta)(\eta_{PTD})(F[\nu])A \quad (2)$$

where $\eta_{PTD}$ = quantum efficiency of collector base junction
$F[\nu]$ = incoming light flux
A = base area exposed to light flux.

Substituting equation (1) into equation (2) gives:

$$I_C = I_{Cl}^{\frac{n}{n-1}} (\eta_{PTD} \cdot F[\nu])^{\frac{1}{1-n}} \cdot (\beta' A)^{\frac{1}{1-n}} \quad (3)$$

In equation 3, the phototransistor output current ($I_C$) has been written as the product of three terms. The second term $(\eta_{PTD} \cdot F[\nu])^{(1/1-n)}$ corresponds to the photogenerated collector base junction current. The second term fluctuates due to variations of $\eta_{PTD}$ and $n$ since $F[\nu]$ is assumed constant. Experience further indicates that the term $\eta_{PTD}$ is uniform for phototransistors of the same type. Similarly, the term $n$ is essentially constant for a considerable range of emitter area and perimeter. Thus the second term is essentially constant across the array and may be disregarded in achieving a uniform current from the array. The third term or $(\beta'A)^{(1/1-n)}$ represents the current gain for a phototransistor in the array. The term $\beta'$ ranges over a distribution of values for a given array of phototransistors. These variations in $\beta'$ can be adjusted by reducing the area (A) of each device to match the $\beta'A$ for the phototransistor with the smallest $\beta'$. The area reduction factor (ARF) can be obtained from the following relations:

The element with minimum $\beta$ has a current response $I_m$ $$I_m = I_{CI}^{\frac{n}{n-1}} (\eta_{PTD} F[\nu])^{\frac{1}{1-n}} (\beta'_m A)^{\frac{1}{1-n}} \quad (4)$$

For any other element, the current response is given by $$I_x = I_{CI}^{\frac{n}{n-1}} (\eta_{PTD} F[\nu])^{\frac{1}{1-n}} (\beta'_x A)^{\frac{1}{1-n}} \quad (5)$$

In equations (4) and (5), a common factor $n$ is applied to all devices based on the observation described above in connection with FIG. 3.

Relative to the minimum response, $I_x$ is obtained by dividing equation 4 into equation 5, as follows:

$$I_x = I_m \left( \frac{\beta'_x A}{\beta'_m A} \right)^{\frac{1}{1-n}} \quad (6)$$

These responses will be equal if the area of the $x$ element is reduced by the factor $\beta_m'/\beta_x'$. The $\beta_m'/\beta_x'$ ratio is obtained from (6) when $I_x$ and $I_m$ are measured with $A_x = A_m$. Hence, the area reduction factor is:

$$\frac{\beta'_m}{\beta'_x} = ARF = \left[ \frac{I_m}{I_x} \right]^{1-n} \quad (7)$$

The area reduction factor (ARF) or scaling factor for each device can be obtained by automatic testing of the array after fabrication. The output current ($I_C$) of each device is measured for an input light flux which biases the array device within a current range below the $\beta$ peak. To determine $n$, the phototransistor $T_m$ with the lowest output current is measured at two known light fluxes. While $T_m$ has been selected as the reference device, any other device could serve as well since $n$ is uniform across the array. That is to say, any phototransistor ($T_C$) can be selected for determining $n$. $T_m$ has been selected for reasons of convenience. The slope of the curve, $n$, is then obtained from the ratio of the corresponding current output using equation 3. With this information the ARF for each phototransistor is determined by assuming that $n$ is constant over the array as evidenced by FIG. 3.

The process for reducing the active base regions of the phototransistors in the array will now be described in conjunction with FIG. 4.

The array shown in FIG. 1 is fabricated in an operation 50 using well known semiconductor processing steps, as described for example in U.S. Pat. No. 3,508,209 to B. Augusta, et al entitled "Monolithic Integrated Memory Array Structure Including Fabrication and Package Thereof" issued Apr. 21, 1970 and assigned to the present assignee. The array is fabricated without the mask 44 and the openings 34 over their respective base regions 24. Automatic testing is undertaken in an operation 52 to determine the variables for equation (7) which is necessary to determine the size of the openings over the respective phototransistors in the array. A conventional tester, as for example a Fairchild Sentry 600, is used to quantify the parameters of equation (7) for each phototransistor in the array. A light flux of the order of $4 \times 10^{-3}$ watts/cm$^2$ is directed on the array which is appropriately connected to the automatic tester. An appropriate program is loaded in the tester to conduct an operation 54 on the array to measure and store the current response, $I_x$, of each phototransistor in the array to the light flux. The tester conducts an operation 56 to search the stored currents to determine (1) the minimum current response, $I_m$, and (2) the location of the device ($T_m$) in the array associated with $I_m$. After identifying $T_m$, the tester is operated to determine the change in $I_m$ for changes in flux density. Incremental flux densities are selected to exercise the working range of $T_m$. The number of flux increments selected, typically two, permits the parameter $n$ or the slope of the log-log plot of beta versus $I_C$ to be determined for $T_m$. When the flux density (F) is applied, the tester measures and stores the current response for $T_m$. The light flux is increased to kF, where $k$ is an integer, in an operation 60 and the tester measures and stores the current of $T_m$. The parameter $n$ is calculated in an operation 62 from the tester data and equation 3.

The parameter $n$ can also be determined without using a light flux. A test transistor of the same geometrical dimensions as those of the array, as shown in FIG. 1, is formed in the semiconductor 20 at a location adjacent to the array 22. The device 23 includes collector region 25, base region 27 and emitter region 29. Each region includes an ohmic contact 31e, 31b, 31c that extends above the dielectric 48. The transfer efficiency or beta versus collector current is measured for the test phototransistor by standard three-terminal measuring techniques. The slope or $n$ of the logarithmic beta-collector current plot is calculated by conventional curve fitting mathematics. It is well established in semiconductor technology that a test device will have characteristics within the same tolerance range as the array devices formed in the semiconductor.

Figure 4:
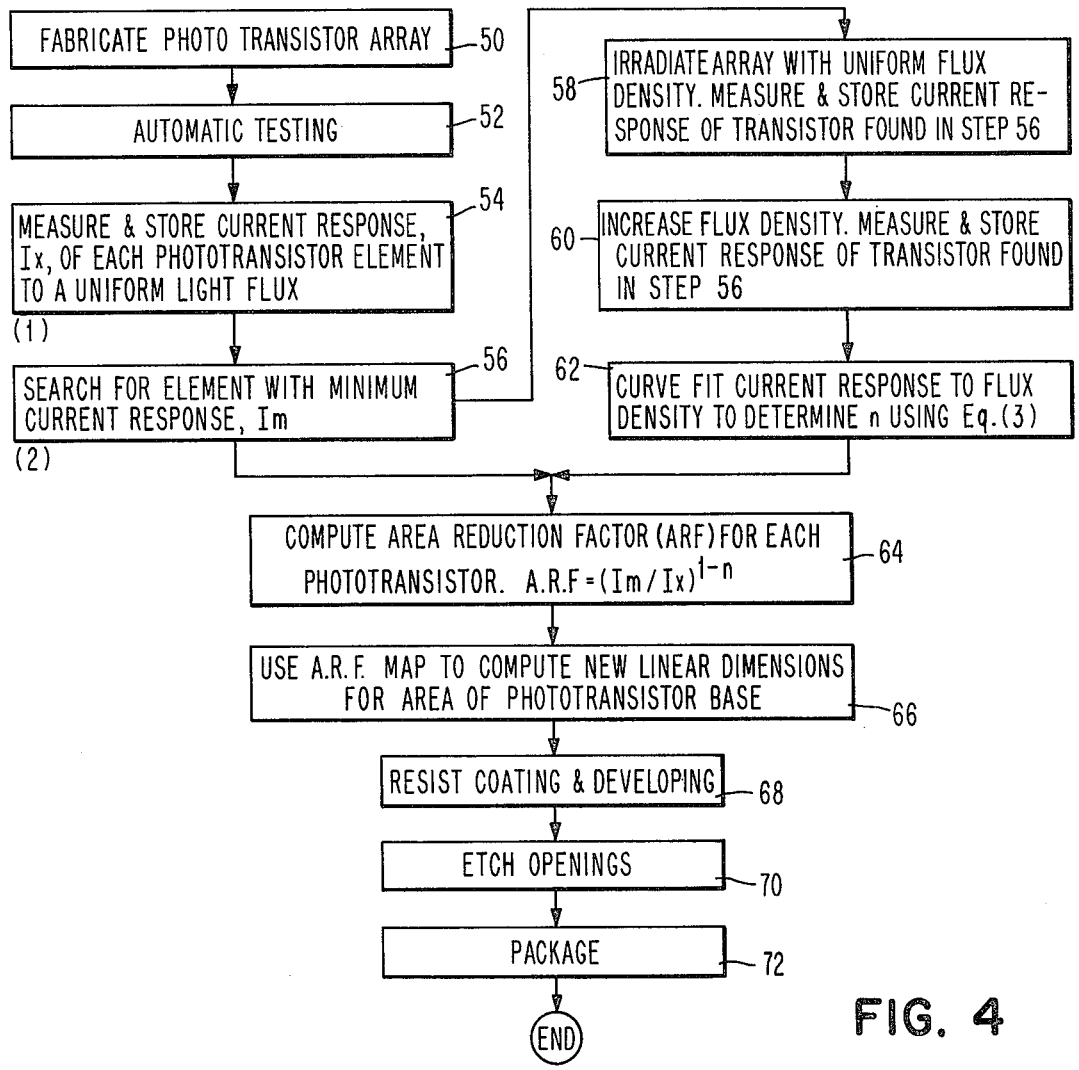
FIG. 4 is a flow diagram for fabricating the phototransistor array of FIGS. 1 and 2.

Having determined $I_m$, $I_x$ and $n$, an operation 64, as shown in FIG. 4, calculates the ARF for each phototransistor in the array. All calculating or computing operations are performed on a conventional computer. An operation 66 computes the linear dimensions of the openings over the base regions of the phototransistors in the array, based upon the area of the opening $A_m$ of the device $T_m$. The dimensions of each opening are tabulated for the phototransistors in the array and stored in a file.

The array is returned for further processing after testing, computing and tabulating the linear dimensions of the openings for the respective phototransistors. A positive acting photoresist is applied to the surface of the array in an operation 68. In one form, the photoresist is a poly-methyl-methacrylate (PPM) an electron sensitive photoresist. Prior to application, the photoresist is made opaque to light flux within the working spectrum of the array. For the visible range, a finely ground carbon powder or lamp black is included in the PPM solution. In one form, carbon black is added to the PPM solution in the ratio of 0.5 to 10.0 parts by weight percent of carbon black properly dispersed, in the PPM having thickness of up to 8000A.

In an operation 70, the photoresist is developed and etched with masks to define the openings over the base regions. The use of conventional glass or film masks and chemical etches is not acceptable where the area dimensions of each opening are not reproduced within 0.1 mil. Typically, the dimensions are of the order of 0.5 to 0.7 mils. Dimensional changes of 0.1 mil or more from the calculated openings will not achieve the same collector current for each phototransistor in the array to a given light flux. Additionally, the need of a different mask for each array also makes the mask method expensive.

A second method of defining openings in the mask is by electron beam lithography as shown for example in U.S. Pat. No. 3,699,304 to E. C. Baldwin, Jr., et al entitled "Electron Beam Deflection Control Method and Apparatus" issued Oct. 17, 1972 and assigned to the present assignee. Such electron beam apparatus is programmable from the file of tabulated dimensions of openings for each phototransistor. The apparatus directs a beam to expose the resist which is subsequently developed to form the prescribed openings over the base areas for each phototransistor. The resist PPM is well suited for electron beam etching as described in an article entitled "Electron Resist for Microcircuit and Mask Production" by M. Hatzakis which appeared in the Journal of Electrochemical Society, July 1969, pages 1033-1037. Areas in the resist defined by the beam are faithfully reproduced at the oxide surface without enlargements or reductions since the walls of the PPM resist opening are near vertical. The beam is sequentially stepped to each phototransistor in the array from signals generated from the file developed in the operation 66. The unexposed resist is left permanently in place on the array as a light blocking mask except in the areas over the terminal pads to which the input/output circuitry is connected. The resist, in addition to serving as a mask, also fills in any oxide pin holes which improves the array reliability. An operation 72 is performed to clean the array and mount the chip on a suitable substrate for subsequent packaging and use in opto-electronic machines and processes.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A light sensing array having uniform current response comprising:
   a. a semiconductor substrate including a plurality of active phototransistors;
   b. a metallization layer interconnecting the phototransistors,
   c. an opaque polymer layer, developable by exposure to an electron beam, adhered to the semiconductor and covering the active phototransistors and metallization layer to control effective base areas of the phototransistors,
   d. openings of predetermined different sizes in the opaque layer over the active phototransistors to achieve identical current response from each phototransistor when exposed to uniform light flux,
   e. the size of an opening over each phototransistor is given by the relation $(I_m/I_x)^{1-n}$ where $I_m$ is the minimum collector current measured for the array; $I_x$ is the collector current for the phototransistor beneath the opening and $n$ is a constant definitive of the change in beta of a phototransistor in the array over a given range of collector currents, and
   f. the array obtaining maximum output current by utilization of maximum base area of the phototransistor having minimum beta.

2. The light sensing array of claim 1 wherein the phototransistors are arranged in a matrix of rows and columns, the columns being separated by isolation elements, each column having a common electrical connection and each row of phototransistors being connected together at a common electrode.

3. A process for fabricating a phototransistor image array having uniform current response comprising the steps of:
   a. fabricating a semiconductor substrate including a plurality of phototransistors arranged in rows and columns and covered by an insulating layer having openings to each emitter electrode in a row and the common collector region for the phototransistors in a column,
   b. determining the minimum collector current value for the phototransistors in the array when a uniform light flux is directed on the array,
   c. calculating an area reduction factor for each phototransistor element to achieve a uniform current response for the array,
   d. coating the array with an opaque polymer, and
   e. etching the opaque polymer at each phototransistor to achieve an opening in the opaque polymer over the phototransistor base whereby a uniform current is generated by each phototransistor when subject to a uniform light flux.

4. The process of claim 3 wherein the area reduction factor is calculated from the relation $(I_m/I_x)^{1-n}$ where $I_m$ is the minimum collector current measured for the phototransistors in the array; $I_x$ is the collector current for the phototransistor beneath an opening, and $n$ is a constant definitive of the change in beta of a phototransistor in the array over a given range of collector currents.

5. The process of claim 3 wherein the opaque polymer mask is compounded from 0.5 to 10.0 parts by weight of carbon black to a positive photoresist solution that has a thickness of up to 8,000A.

6. The process of claim 3 wherein the calculated area reduction factors for each phototransistor are tabulated and operate an electron beam apparatus to define openings in the opaque polymer corresponding to the area reduction factor.

* * * * *